United States Patent [19]
Cartman et al.

[11] Patent Number: 5,479,640
[45] Date of Patent: Dec. 26, 1995

[54] MEMORY ACCESS SYSTEM INCLUDING A MEMORY CONTROLLER WITH MEMORY REDRIVE CIRCUITRY

[75] Inventors: Frank P. Cartman, Poughquag; Brian W. Curran, Saugerties; Matthew A. Krygowski, Hopewell Junction; Tin-Chee Lo, Fishkill; Sandy N. Luu, Wappingers Falls, all of N.Y.; Sanjay B. Patel, Cary, N.C.; William W. Shen, Poughkeepsie, N.Y.

[73] Assignee: International Business Machines Corporation, Armonk, N.Y.

[21] Appl. No.: 85,215

[22] Filed: Jun. 30, 1993

Related U.S. Application Data

[63] Continuation-in-part of Ser. No. 576,253, Aug. 31, 1990, abandoned, which is a continuation of Ser. No. 39,549, Mar. 29, 1993.

[51] Int. Cl.[6] .................................................. G06F 12/02
[52] U.S. Cl. .............. 395/438; 395/421.02; 364/DIG. 1; 364/254.3; 371/40.1
[58] Field of Search ...................................... 395/425, 400; 371/10.1, 40.1

[56] References Cited

U.S. PATENT DOCUMENTS

| | | | |
|---|---|---|---|
| 4,623,986 | 11/1986 | Chauvel | 395/425 |
| 4,701,843 | 10/1987 | Cohen | 395/425 |
| 4,725,987 | 2/1988 | Cates | 365/220 |
| 4,803,621 | 2/1989 | Kelly | 395/400 |
| 4,807,622 | 2/1989 | Ohkaka et al. | 606/167 |
| 4,823,324 | 4/1989 | Taylor et al. | 365/230.03 |
| 4,839,796 | 6/1989 | Rorden et al. | 395/425 |
| 4,918,645 | 4/1990 | Lagoy, Jr. | 395/425 |
| 4,979,145 | 12/1990 | Remington et al. | 395/425 |
| 5,042,014 | 8/1991 | Pinkham et al. | 365/230.05 |
| 5,111,386 | 5/1992 | Fujishima et al. | 395/425 |
| 5,129,059 | 7/1992 | Hannah | 395/166 |
| 5,144,692 | 9/1992 | Baker et al. | 395/425 |
| 5,159,679 | 10/1992 | Culley | 395/425 |
| 5,172,341 | 12/1992 | Amin | 365/222 |
| 5,179,687 | 1/1993 | Hidaka et al. | 395/425 |
| 5,185,719 | 2/1993 | Dhong et al. | 365/189.01 |
| 5,267,242 | 11/1993 | Lavallee et al. | 371/10.1 |
| 5,274,646 | 12/1993 | Brey et al. | 371/40.1 |

*Primary Examiner*—Rebecca L. Rudolph
*Assistant Examiner*—Kiep T. Nguyen
*Attorney, Agent, or Firm*—Whitham, Curtis, Whitham & McGinn; Lynn L. Augspurger

[57] ABSTRACT

A memory access system for improving memory access when addressing dynamic random access modules (DRAMs). The memory access system includes a main memory and a memory controller. To improve memory access, both the memory controller and the main memory hardware remember the row address of the last access. Macro operation commands for fetch and store contain the last row address. The main memory hardware redrives that row address to the DRAMs after completion of an access, so that the memory controller need not provide a row address to the memory for each command of a command sequence.

12 Claims, 7 Drawing Sheets

MEMORY ACCESS SYSTEM INCLUDING A MEMORY CONTROLLER WITH MEMORY REDRIVE CIRCUITRY

The present application is a continuation-in-part and related to the following co-pending patent application: U.S. patent application Ser. No. 07/576,253, filed Aug. 31, 1990 by B. W. Curran entitled "Method and Apparatus for Memory Row Redrive with Previous Row Address Store and Compare", which is continued as U.S. Ser. No. 08/039,549, filed Mar. 29, 1993.

FIELD OF THE INVENTION

This invention relates to information processing computer systems and more particularly to computer systems in which the main memory is implemented with dynamic random access modules (DRAMs).

These co-pending applications are owned by one and the same assignee, International Business Machines Corporation of Armonk, N.Y.

The descriptions set fodh in these co-pending applications are hereby incorporated into the present application by this reference.

GLOSSARY OF TERMS

While dictionary meanings are also implied by certain terms used here, the following glossary of some terms may be useful.

| | |
|---|---|
| DRAM | Dynamic Random Access Memory modules |
| RAS | Row Address Strobes |
| CAS | Column Address Strobes |
| PMC | Processor Memory Controller |
| BSM | Basic Storage Module |
| BMC | Basic Memory Controller |
| MSA | Main Storage Array |
| CPU | Central Processing Unit |
| ROW_ADD | Row Addresses |
| COMP-RECOMP | Complement-Recomplement |
| HAMT | Hardware Assisted Memory Tester |
| FSFS | Fetch-Store-Fetch-Store Macro |
| UE | Error Uncorrectable by ECC |
| ECC | Error Correction (and Detection) Code |
| DPL | Data Path Logic including Fetch Buffer |
| DW | Double-Word consisting of 64 bits data and 8 ECC check bits |
| QW | Quad-Word consisting of two DWs concatinated to one another |
| Double Line | A block of data consists of 16 QWs |

BACKGROUND OF THE INVENTION

Processor Memory controllers (PMC) which multiplex the row and column addresses onto a single bus and which generate the critical row and column address strobes (RAS and CAS) sequences required by main memories (hereinafter referred to as Basic Storage Modules or BSMs) exist today.

Prior art: Patents

Memory Access systems which generate RAS and CAS sequences are illustrated by U.S. Pat. No. 4,701,843 of Morris Cohen entitled REFRESH SYSTEM FOR A PAGE ADDRESSABLE MEMORY. Other page addressable memories include Intel's Ripplemode. Other page mode patents include U.S. Pat. Nos. 4,803.621: 4,807,622: 4,839, 796; 4,823,324 and 4,623,986. FIG. 3 of the Cohen patent illustrates some shortcomings in the prior art before the related prior application of Brian Curran. In page mode the RAS strobe remains active or low until a change in the row address of sequential accesses is delected. A problem is that one cannot predict when the next access occurs, thus the RAS signal to DRAMs must remain active indefinitely, and in addition significantly more power is required when the RAS remains active. Another problem with the prior art is that one could not predict whether the next access will be in the same page. If it is not, then a significant latency penalty will be incurred in deactivating RAS, observing RAS precharge time, and reactivating RAS for the new row address.

INTRODUCTION TO INVENTION SUMMARY

This invention is a simplified version of U.S. patent application Ser. No. 576,253, filed Aug. 31, 1990 by B. W. Curran entitled "Method and Apparatus for Memory Row Redrive with Previous Row Address Store and Compare" which we hereafter call it K19 for simplicity. Like Brian W. Curran's earlier application, as we illustrate by FIG. 4, our RAS signal goes active before a subsequent access, as opposed to being held active. We will summarize some basic concepts and then go on to summarize and describe, in detail, the present invention.

A Basic Memory Controller, a typical memory controller, to the BSM interface sequence is shown in FIG. 2. The basic generic hardware which generates such interface sequences is shown in FIG. 1.

Referring to FIGS. 1 and 2, there is illustrated the hardware and the operational timing waveforms for a particular basic controller. Processor fetch and store requests are prioritized by the priority logic 11 in the Processor Mentory Controller (PMC) 10. When a given operation has been selected, the priority logic 11 provides an active status signal on the array start line. This array start active signal is applied to select gate 15 to select the row and then the column addresses to be gated into the row/column address latch 17. The row address in this particular system is selected in the first cycle of the array operation (or access) and then the column address is selected just prior to the fifth cycle of the access. Also the array stad activates an array timer 19 which is a counter. On receiving active array start status the array timer 19 is initialized to a count of one. A clock 19a is inputted into the array timer 19 to increment the counter every cycle. The output of the array tinier 19 is applied to timing logic 18, which immediately provides an address valid for the first cycle of the access, and when there is a count of four to eleven cycles, provides an active row address strobe (RAS) signal (low level) to the RAS latch 23 on the BSM card 20. Also at about a count of six cycles, the CAS signal (column address strobe) is provided to the CAS latch 22 on the memory card 20. The memory card control logic 20a includes a row/column address latch 21, CAS latch 22 and RAS latch 23. Also the timing logic 18 provides an address valid when the counter reaches a value of five cycles. The address valid signal from logic 18 gates the latch 21 in memory card 20 to latch the row and column address applied through the interface at the card row/column address latch 21. The row/column address at latch 21 which is part of the memory card control logic 20a is sent on to address the; DRAMs along with the RAS signal front DRAM control latch 23 and the CAS signal from DRAM control latch 22. The DRAMs are a plurality of memory chips on the memory card 20 which receive the addresses and the RAS strobe and CAS strobe signals which are sequenced as shown in FIG. 2 during memory read and write operations. With this as background, we now can review the prior application which is used in connection with the present invention.

In accordance with the embodiment described in the K19 application U.S. patent application. Ser. No. 576,253, filed Aug. 31, 1990 by B. W. Curren entitled "Method and Apparatus for Memory Row Redrive with Previous Row Address Store and Compare" an improved memory access system is provided by memory means for storing data wherein the memory means includes a plurality of storage locations, each of the locations specified by one of a plurality of first addresses followed by one of a plurality of second addresses. Control means for accessing the data at specified locations is provided by a first address and a first strobe signal followed by a second address and a second strobe signal. The first strobe signal goes inactive before the beginning of the next access. The memory means when the first strobe signal goes inactive automatically switches from the second address back to the previous first address. The control means furthers includes means for storing the first address and on each access and for comparing the next first address with the previous first address. If there is a compare the control immediately activates the first strobe signal to the memory to permit the previous first address to access the memory, and if there is not a compare the control accesses the memory by the new first address and the first strobe signal.

In addition, we would note that there are publications and patents of which we are aware which are listed below with a brief discussion of each of the publications and patents.

SUMMARY OF THE INVENTION

In a computer system where a page of data is spread over a large number of MSAs (Main Storage Arrays), and many CPUs execute concurrently castouts with different ROW__ADDresses following closely to the same MSA, the chance of having present ROW__ADD same as previous ROW__ADD may be slim. In such a highly interleaved memory system, our redrive can be implemented with special commands which are macro in type ensuring common row address sequences. A specific design for these macro operation commands will result in hardware simplification. This aspect of the redrive concept simplifies the redrive, and allows simplification of circuitry in the instances described.

These and other improvements are set forth in the following detailed description. For a better understanding of the invention with advantages and features, refer to the description and to the drawings.

BRIEF DESCRIPTION OF THE DRAWINGS

Note: FIGS. 1 to 4 are same as those for U.S. Ser. No. 576,253.

(Note: For convenience of illustration, FIGURES may be separated in parts and as a convention we place the top of the FIGURE as the first sheet, with subsequent sheets proceeding down and across when viewing the FIGURE, in the event that multiple sheets are used.)

Our detailed description explains the preferred embodiments of our invention, together with advantages and features, by way of example with reference to the following drawings.

DETAILED DESCRIPTION OF THE INVENTION

Before considering our preferred embodiments in detail, it may be worthwhile to illustrate, by way of example, the earlier drawing contained in U.S. Ser. No. 576,253 discussed above.

Figure 1:
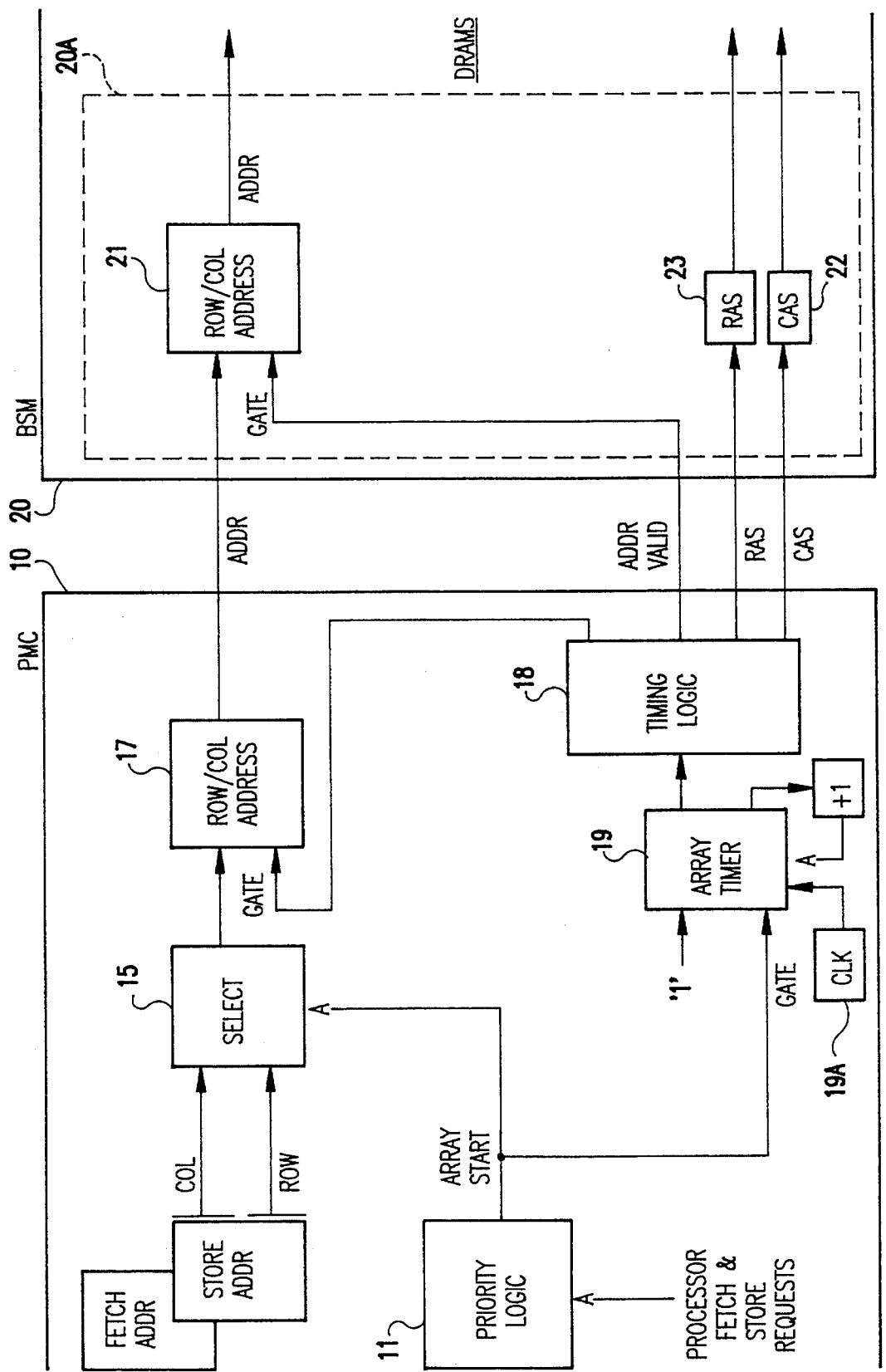
FIG. 1 is the basic controller hardware used to generate the interface sequence as shown in FIG. 2.
Figure 2:
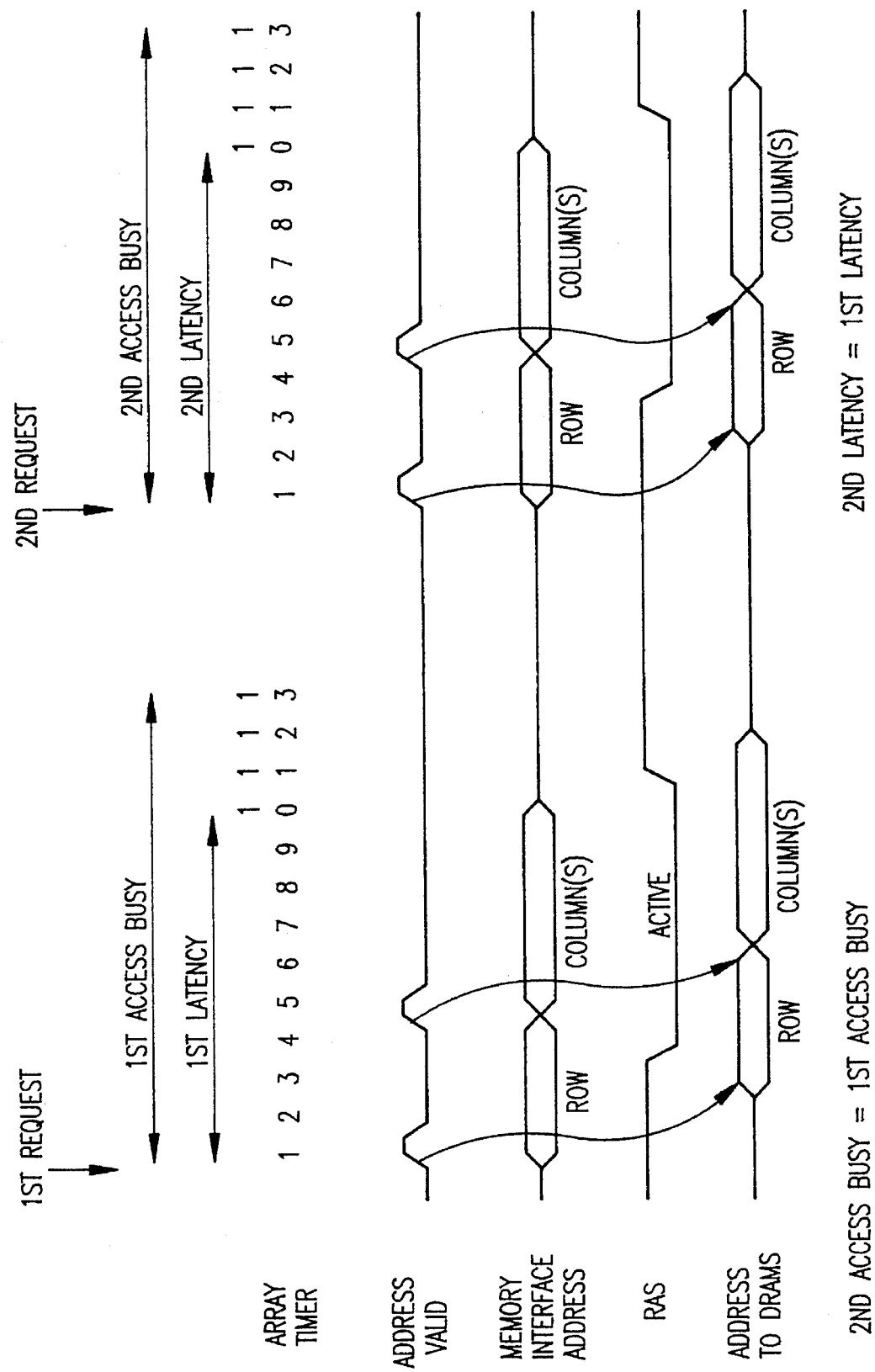
FIG. 2 is a timing diagram for the basic memory controller.
Figure 3:
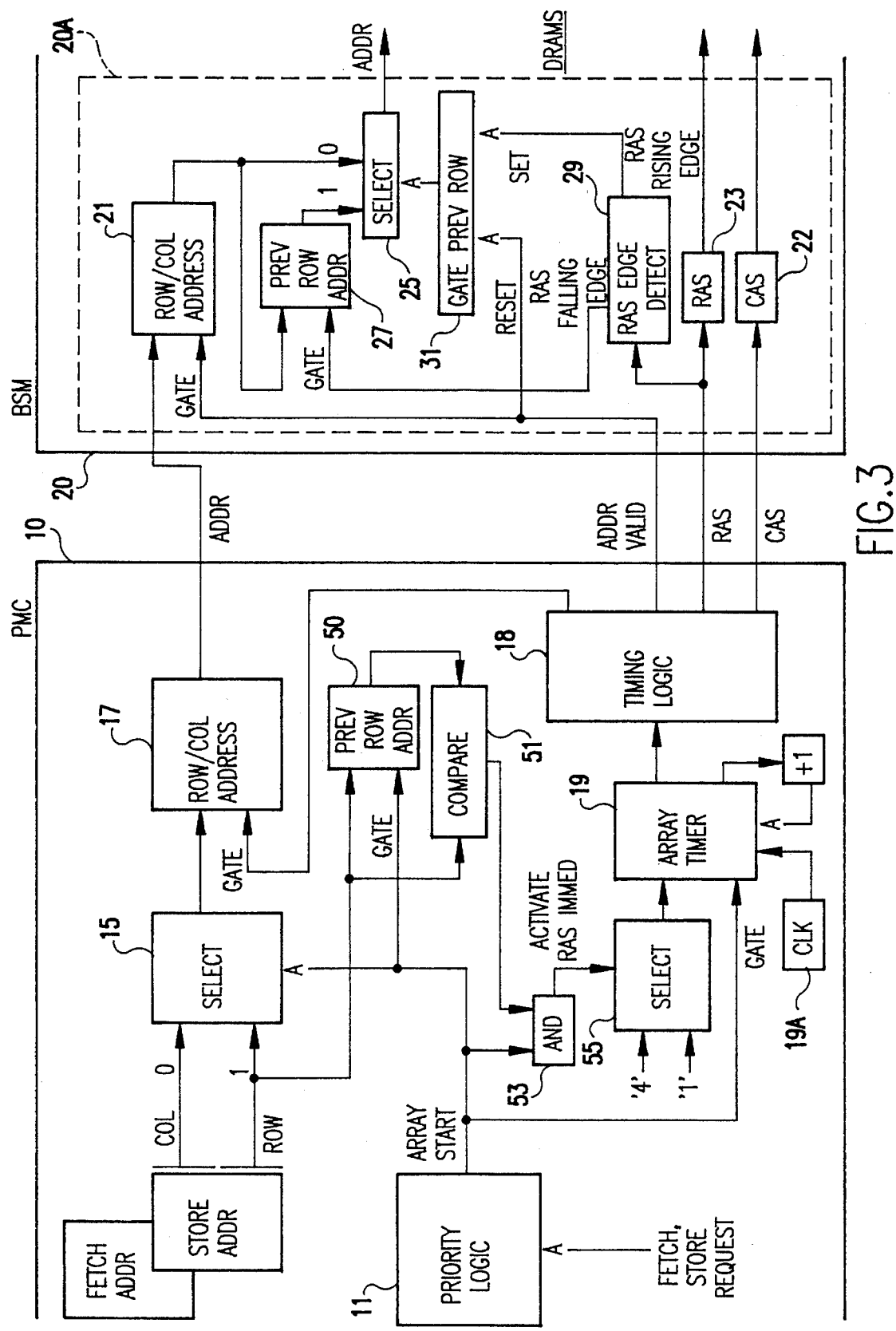
FIG. 3 is a memory row redrive according to K19.

Referring to FIG. 3 there is illustrated the memory row redrive system in accordance with this prior application wherein in addition to the hardware described in connection with FIG. 1, there is in the memory controller 10, a previous row address latch 50, an AND gate 53, a selector 55 and compare circuit 51. Selector 55 normally provides a count of "one" to array timer 19. The row address compare circuit 51 is coupled to receive the current row address and a previous row address from register (unreferenced). Latch 50 receives the current row address and latches this address when the array start is active. The output from the previous row latch 50 is provided to the compare circuit 51 for comparing the current row address with the previous row address. The output of the compare circuit 51 is ANDed with the array start signal at gate 53 for selecting or preloading a count value greater than one from selector 55 into the array timer 19 to skip memory access cycles. In the embodiment described in this prior application, when there is a compare at circuit 51 and the array start becomes active the AND gate 53 output causes the count of four to be loaded into the array timer 19 from select 55, allowing immediate generation of the RAS signal from the timing logic 18.

To the memory card control logic 20a is added select gate 25, Previous Row Address Register 27, RAS Edge Detect Logic 29 and flip-flop device 31. The output from the row/column address latch 21 is sent to the "0" input of select gate 25 which normally gates the output from the row/column address latch 21 to the DRAMs. The row output from the row/column latch 21 address is also applied to the Previous Row Address Register 27 which latches the previous row address when gated by the RAS falling edge (low level is active state). The BSM further includes a RAS edge detect logic 29 which detects the RAS falling edge and provides the enable gate to latch the row address at register 27. The detect logic 29 also detects the RAS rising edge and provides a set signal to flip-flop 31. The set state of flip-flop 31 provides a switch control signal to Select gate 25 to drive the previous row address from Previous Row Address Register 27 to the DRAMS via the "1" input of selector 25. Note in FIG. 4 how upon the deactivation of RAS the previous row address is immediately sent to the DRAMs. The tinling logic 18 provides an address valid both to the row/column address latch 21 and to flip-flop 31 to reset it. When the RAS edge detect logic detects a rising edge it sets flip-flop 31 and the previous row address is gated.

Figure 4:
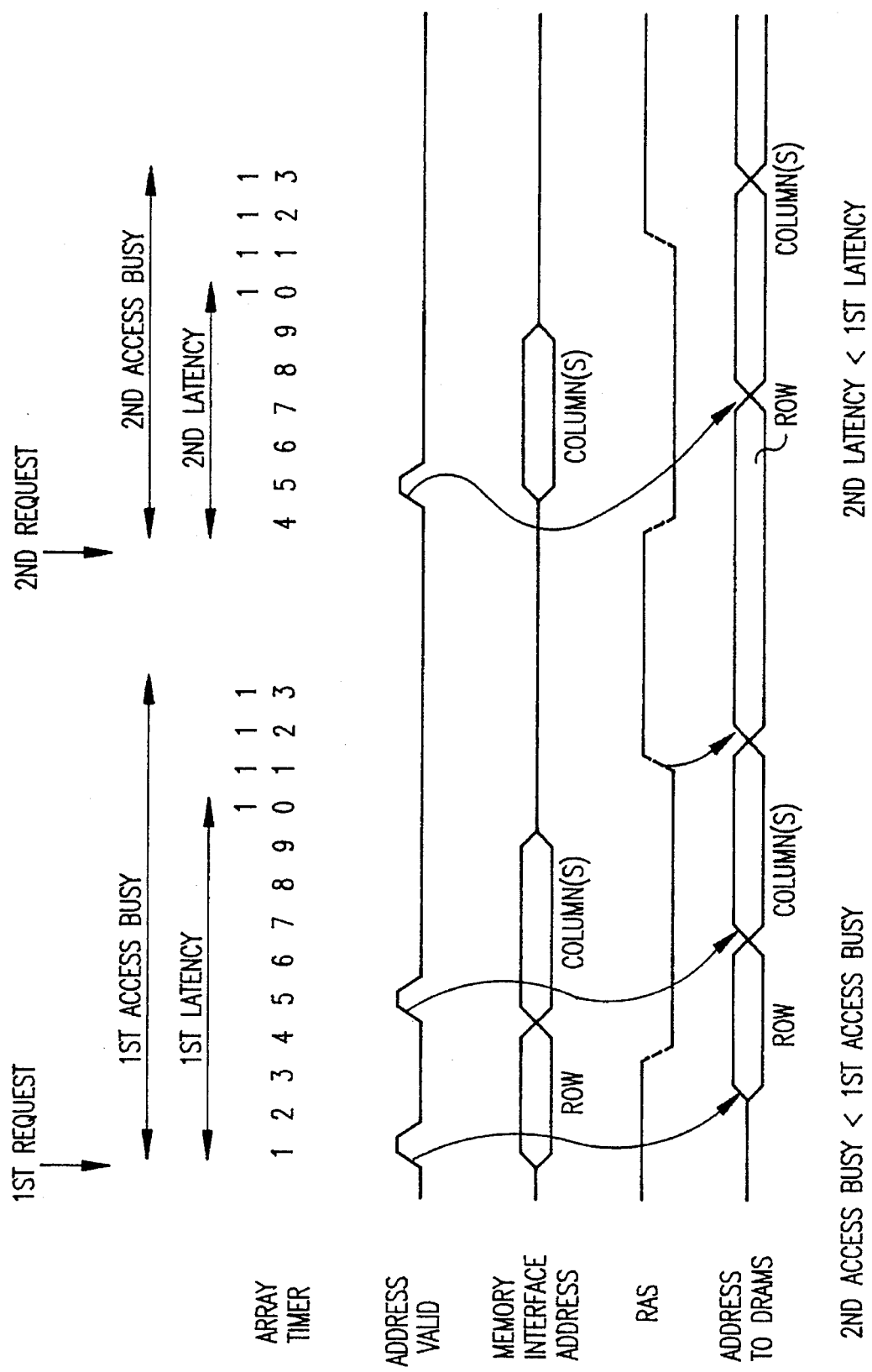
FIG. 4 illustrates the waveforms for the operation of the system in accordance with FIG. 3.

The timing sequence of the system shown in FIG. 3 is explained using the timing diagrams in FIG. 4. When the logic priority 11 detects a fetch or a store request, it provides an array start signal to select gate 15 to cause the initial row address to be gated into the row/column address latch 17 of the controller 10. That row address is also gated into the Previous Row Address latch 50. When the RAS detect logic 29 detects the RAS falling edge at a count of four, it provides a gating signal to the previous Row Address Register 27 to load the row address present at latch 21 in the Previous Row Address register 27. The initial row address is followed by the column address that is also gated via select 15 to the row/column address latch 17. Since there was no previous row there is not a compare at compare circuit 51 and as discussed previously, the normal count of one is selected at selector gate 55 and provided to the array timer 19. The timing logic 18 then provides the active RAS signal (low level) to the BSM logic 20 to latch 23 as discussed previously to provide the RAS to the DRAMs. The address valid applied from the timing logic gates the row address to latch 21 and resets flip-flop 31, then gates the selector 25 to the position which normally couples the address at "0" input to the DRAMs. The address valid then inactivates for several cycles. As discussed previously, just prior to a count of five the column address is selected and latched in the row/column address latch 17 of the controller 10 via the select 15 and at the count of five latched in the BSM logic at latch 21 with the activation of address valid. Following the column address and at timing count of eleven the RAS strobe from the timing logic 18 goes high or inactive. This is detected by the RAS Edge Detect Logic 29 providing a set signal to flip-flop 31 to gate the previous row address from register 27 to the DRAMs. The row address associated with tile next access is then compared to the Previous Row Address Register latch 50 and if there is a compare at compare circuitry 51 and the array start is active, AND gate 53 provides a control signal to the selector 55 to "advance" the counter of array timer 19 a count of four rather than a count of one. Thereafter, as long as the rows compare, RAS strobe is activated immediately since the previous row address is already stable at the inputs to the DRAMs. When the next address valid signal occurs in each access the flip-flop 31 is reset and places the select switch back to coupling from the "0" input position to receive the column address latched at gate 21. When there is not a compare at compare circuit 51 and the array start is active, the normal count of one is loaded in the array timer 19. The system operates in the original manner to not advance the count and to gate the current row address to the BSM. The timer logic 18 provides the RAS strobe between clock cycles of four to eleven, the GAS strobe at about the count of six and the address valid pulses at counts one and five.

The Preferred Embodiment

Turning now to our invention in greater detail, we illustrate the improvements to the red rive by illustrating the same elements of the prior FIGURES while providing illustration of the COMP-RECOMP command sequence. Operations are performed on a double line basis. Double line is defined as 16 QW (Quad-Word) and each QW consists of two Double Words (DW). Each DW comes from a BSM and hence two BSMs must be operated at the same time to be responsible for a QW transfer.

Figure 5:
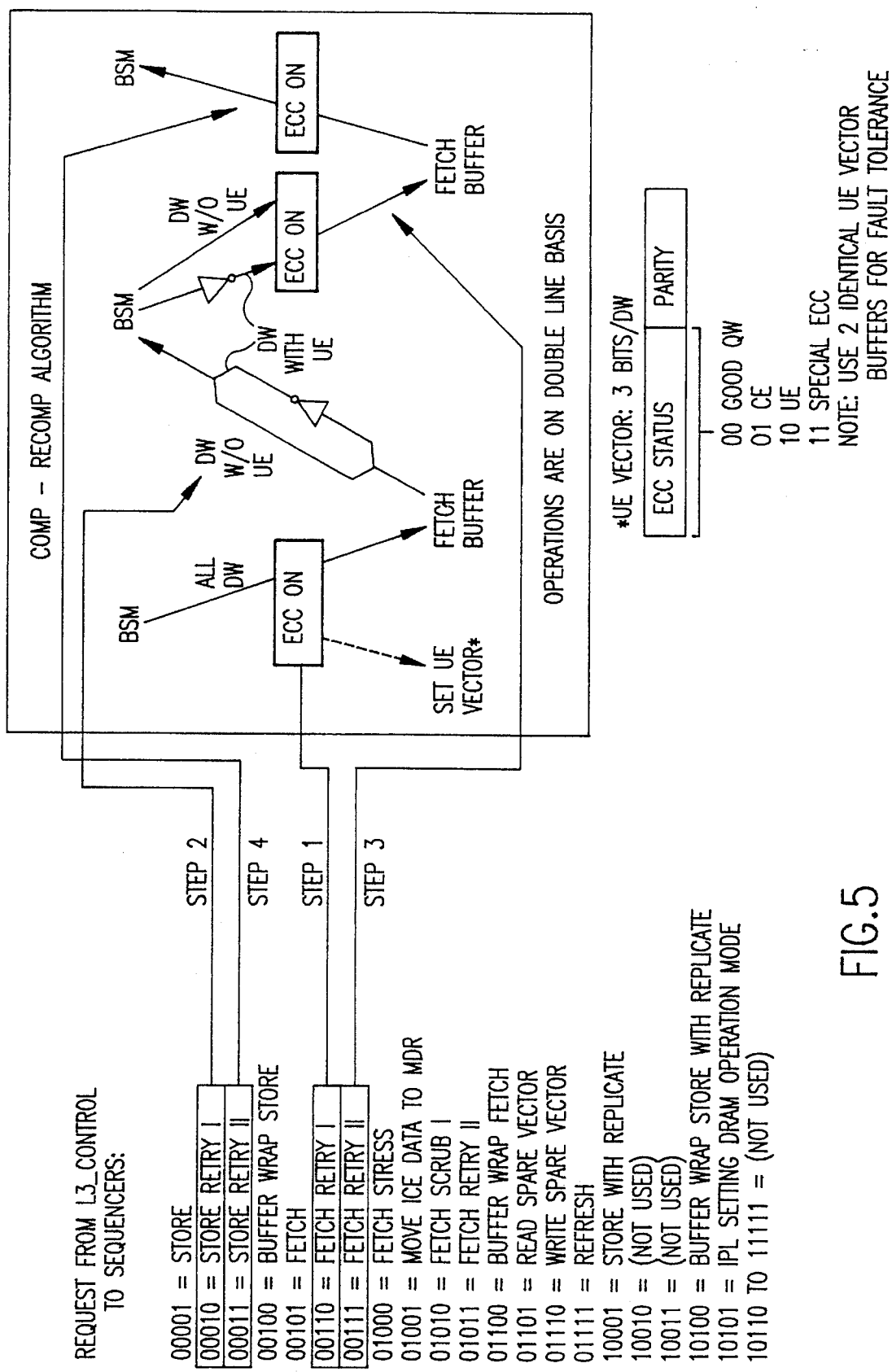
FIG. 5 illustrates the COMP-RECOMP algorithm for fixing UEs used by CPU.

It will be seen there are two special commands to be considered. FIG. 5 shows a COMP-RECOMP command macro which is a group of four atomically coupled macro commands, 00110 Fetch Retry I (F), 00010 Store Retry I (S). 00111 Fetch Retry II (F) and 00011 Store Retry II (S). COMP-RECOMP is used to fix the UE vector buffer that an that ECC fails to correct.

Figure 6:
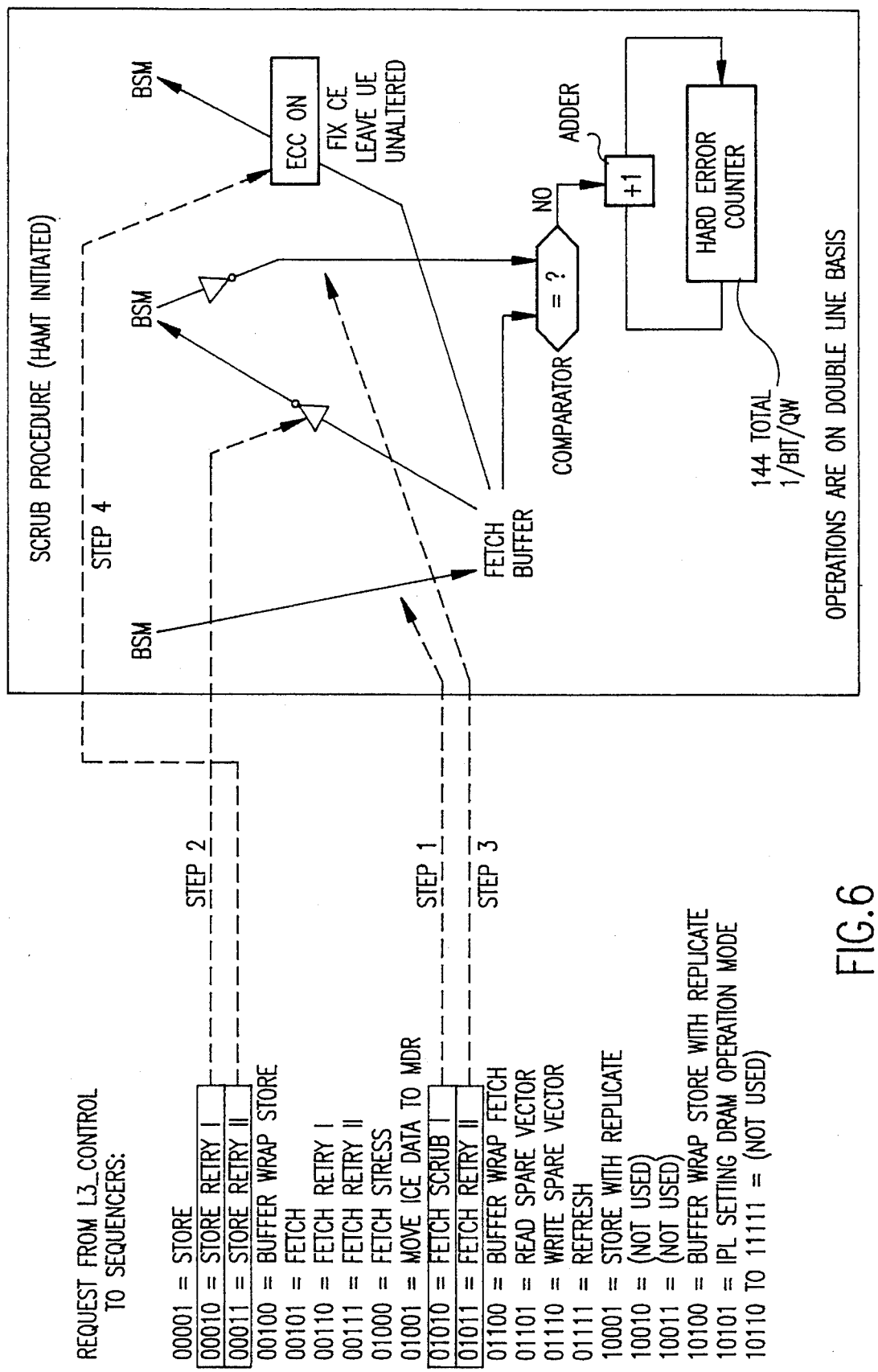
FIG. 6 illustrates the COMP-RECOMP algorithm for fixing soft errors used by HAMT.

FIG. 6 shows a HAMT SCRUB command macro which is a group of four atomically coupled macro commands, 01010 Fetch Scrub I (F), 00010 Store Retry I (S), 01011 Fetch Scrub II (F) and 00011 Store Retry II (S). HAMT SCRUB macro is used to detect the occurrence of hard errors. The number of occurrences is recorded by a counter (one per bit position) as a measure of the "dirty" level of a memory. Soft error in the memory can also be corrected by these steps.

In either macro, it includes an atomically coupled group of fetch/store macro operation which consists of four steps: FSFS. In algorithm, the ROW_ADD used by the first fetch (F) must be re-used by the subsequent store (S) and fetch (F) steps. Since the re-use of the ROW_ADD is guaranteed by the definition of the command, the hardware used to trap and compare can be obviated, greatly simplifying the hardware implementation for redrive.

COMP-RECOMP macro operation of FIG. 5 is now described which consists of four atomically coupled steps issued as a macro.

Step 1: PMC receives a "Fetch Retry I" command from the processor. PMC then issues a Fetch (F) command to BSM and at the same time conditions the Data Path Logic (DPL) so that its ECC logic is active. BSM will eventually return a block of data, one double word (DW) at a time for 16 times. For each DW there is one UE bit which will be set to ONE when ECC detects a UE. These 16 DWs are loaded into the Fetch Buffer which is pad of the DPL.

Step 2: PMC receives a "Store Retry I" command from the processor. PMC then issues a Store (S) command to BSM and at the same time condition the Data Path Logic (DPL) so that its ECC logic is inactive. BSM will eventually receive a block of data from the Fetch Buffer, one double word (DW) at a time for 16 times. For the DW whose UE bit is ON, data inversion takes place before data is stored into BSM.

Step 3: PMC receives a "Fetch Retry II" command from the processor. PMC then issue a Fetch (F) command to BSM and at the same time condition the Data Path Logic (DPL) so that its ECC logic is active. BSM will eventually return a block of data, one double word (DW) at a time for 16 times. For each DW whose UE bit has been ON will go through data inversion before it is corrected by the ECC logic and loaded into the Fetch Buffer.

Step 4: PMC receives a "Store Retry II" command from the processor. PMC then issues a Store (S) command to BSM and at the same time conditions the Data Path Logic (DPL) so that its ECC logic is active. BSM will eventually receive a block of data from the Fetch Buffer, one double word (DW) at a time for 16 times. No data inversion takes place for all 16 DWs. At this final step, what used to be UEs have now been corrected and UE free data is store in the memory.

HAMT SCRUB macro operation of FIG. 6 is now described which consists of four atomically coupled steps issued as a macro. It is used by a HAMT (Hardware Assisted Memory Tester) to scrub soft errors and detect the presence of hard errors it has the similar characteristic as the COMP-RECOMP algorithm.

Step 1: PMC receives a "Fetch Scrub I" command from HAMT. PMC then issues a Fetch (F) command to BSM and at the same time conditions the Data Path Logic (DPL) so that its ECC logic is inactive. BSM will eventually return a block of data, one double word (DW) at a time for 16 times. These 16 DWs are loaded into the Fetch Buffer which is pad of the DPL.

Step 2: PMC receives a "Store Retry I" command from HAMT. PMC then issues a Store (S) command to BSM and at the same time conditions the Data Path Logic (DPL) so that its ECC logic is inactive. Data inversion takes place before data is stored into BSM. Data in the Fetch Buffer remain intact.

Step 3: PMC receives a "Fetch Scrub II" command from HAMT. PMC then issues a Fetch (F) command to BSM and at the same time condition the Data Path Logic (DPL) so that its ECC logic is inactive and data inversion is ON. Data returned from BSM is compared with the original data stored in the Fetch Buffer. Comparison is done on DW basis and one DW at a time. Comparison is also done on bit by bit basis. Inequality in any bit position will result in incrementing the hard error counter by one.

Step 4: PMC receives a "Store Retry II" command from HAMT. PMC then issues a Store (S) command to BSM and at the same time conditions the Data Path Logic (DPL) so that its ECC logic is active. BSM will eventually receive a block of data from the Fetch Buffer, one double word (DW) at a time for 16 times. No data inversion takes place for all 16 DWs. At this final step, what used to be soft errors will be corrected and hard errors have been recorded by counters.

Figure 7:
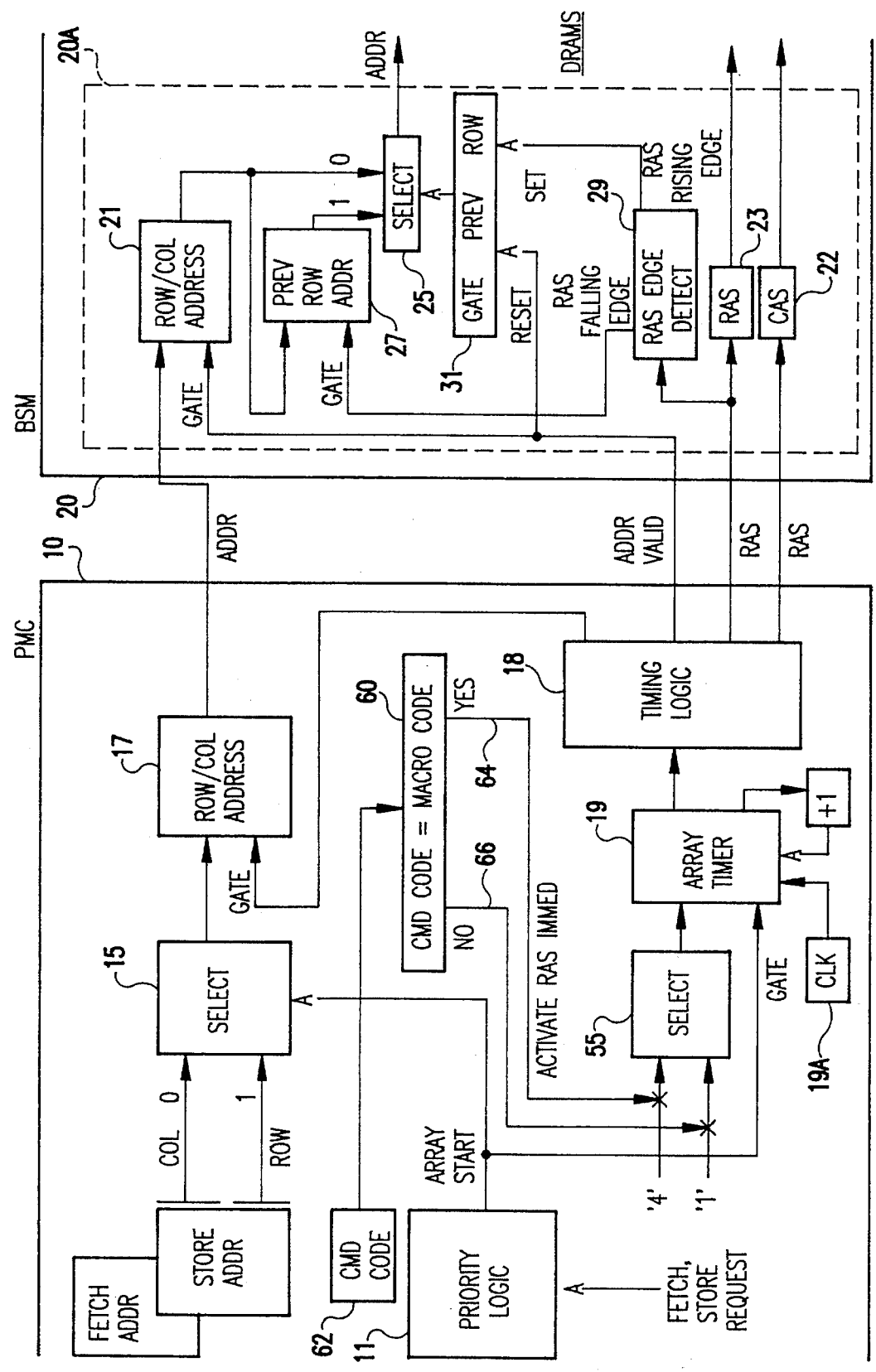
FIG. 7 illustrates the embodiment of this invention which is a simplified version of FIG. 3.

If our redrive is to be implemented for either or both four-step commands alone, the address trapping 50 and compare mechanism 51, AND gate 53 of FIG. 3 can be eliminated. A Special Code Detector or decoder 60 is added to FIG. 3. Now, the hardware can be simplified to result in the configuration shown in FIG. 7. Other logic components having the same label perform the same functions as do those of FIG. 3. Command code (CMD_CODE) register 62 is only shown in FIG. 7 whereas it has been omitted in FIG. 1 and FIG. 3 because it is not relevant to their discussions. CMD_CODE together with the address form the basic parameter of a Request. CMD_CODE register is not looked at until the priority logic 11 has activated its Array Start signal.

When Special Code Detector 60 detects the coming of special macro command code and priority logic 11 has activated the array start signal, controller 10 knows the row redrive criteria have been met, selector 55 will cause the loading of a larger than 1 number (4 in this embodiment) into the array timer 19 and all subsequent timing sequences will follow what has been described in KI9 prior art. The "Yes" signal 64 of Special Code Detector 60 is active when CMD_CODE equals to one of the followings in this embodiment: (00010), (00011), (00111), or (01011). Activation of the Yes Line 64 has the effect of causing the Array Timer 19 to skip count-1 to count-3 and hence eliminate the RAS setup time as described in the prior art mentioned above. The codes corresponding to the first step, (00110) or (01010) or any other code, will cause the "No" line 66 of Special Code Detector 60 to be active resulting in loading number 1 into the Array Timer 19. The Yes line 64 and No line 66 control the Selector 55 in a manner identical to the way the AND gate 53 of FIG. 3 controls the Selector 55 by vidue of a line label "active ras immed" in FIG. 3.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A memory access system, comprising:
   a. memory means for storing data, said memory means having a plurality of storage locations, each of said location being specified by a row and column address;
   b. a memory controller for performing a macro operation, said memory controller receiving a first row address of said row address and a first column address of said column address and executing a predetermined plurality of commands utilizing said first row address and column address, wherein said first row address and said first column address are reused during the macro operation for commands subsequent to a first command of said plurality of commands; wherein each of said commands including a command code, and said macro operation including a macro code; and said plurality of commands including fetch and store commands to fetch and store data to and from said memory means:

said memory controller comprising:.
   1) a system timing unit for controlling the system timing;
   2) a row and column address strobes generating means, coupled to the system timing unit, for generating a row address strobe (RAS) and a column address strobe (CAS), using said first row address and first column address;
   3) special code detector, coupled to said system timing unit, for loading a predetermined count into said system timing means, when a predetermined condition exists. as determined by said special code detector; said system timing unit starts counting at said predetermined count and whereby said RAS is immediately activated, wherein said predetermined condition is when a command code match said macro code.

2. A memory access system as in claim 1 wherein said row address strobe is inactive until said means controller a command of said plurality of commands.

3. A memory access system as in claim 1 wherein said plurality of commands includes a COMP-RECOMP command sequence for detecting and correcting data errors.

4. A memory access system as in claim 3 wherein said COMP-RECOMP command sequence includes a first set of atomically coupled macro commands including a first fetch retry, a first store retry, a second fetch retry, and a second store retry.

5. A memory access system as in claim 4 wherein said COMP-RECOMP command sequence fixes a vector buffer error.

6. A memory access system as in claim 5, wherein operations are performed on a double line basis using double words.

7. A memory access system as in claim 6, wherein said first fetch retry command detects double word errors and directs loading of said double words from said storage locations to a fetch buffer;

said first store retry commands directs unloading of said double words from said fetch buffer to said storage location, wherein said double words are inverted if said double word error is detected by said first fetch retry command;

said second fetch retry command directs loading of words from said storage locations to a fetch buffer and corrects double words which have errors as detected by said first fetch retry command; and said second store retry command directs unloading of error free double words from said fetch buffer to said storage locations.

8. A memory access system as in claim 1 wherein said plurality of commands includes a HAMT SCRUB command sequence for detecting errors in said memory access system.

9. A memory access system as in claim 8 wherein said HAMT SCRUB command sequence includes a second set of atomically coupled macro commands including a first fetch scrub, a third store retry, a second fetch scrub, and a fourth store retry.

10. A memory access system as in claim 9 wherein said HAMT SCRUB command sequence counts the number of errors detected in the memory access system.

11. A memory access system as in claim 10, wherein operations are performed on a double line basis using double words.

12. A memory access system as in claim 11, wherein said first fetch scrub command directs loading of said double words from said storage locations to a fetch buffer;

said third store retry commands directs unloading of said double words in an inverted form from said fetch buffer to said storage locations, wherein said double words remain intact in said fetch buffer;

said second fetch scrub command directs comparing of said double words in said fetch buffer with said double words in said storage locations and increments a hard error counter for each memory access system error detected; and said fourth store retry command directs unloading of error free double words from said fetch buffer to said storage locations.

* * * * *